United States Patent
Nakajima et al.

(10) Patent No.: US 6,916,677 B2
(45) Date of Patent: Jul. 12, 2005

(54) MAGNETIC STORAGE APPARATUS HAVING DUMMY MAGNETORESISTIVE EFFECT ELEMENT AND MANUFACTURING METHOD THEREOF

(75) Inventors: Kentaro Nakajima, Tokyo (JP); Minoru Amano, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/798,571

(22) Filed: Mar. 12, 2004

(65) Prior Publication Data

US 2004/0169214 A1 Sep. 2, 2004

Related U.S. Application Data

(62) Division of application No. 10/406,387, filed on Apr. 4, 2003.

(30) Foreign Application Priority Data

Apr. 5, 2002 (JP) ........................................ 2002-104388
Mar. 17, 2003 (JP) ........................................ 2003-072216

(51) Int. Cl.[7] .............................................. H01L 21/00
(52) U.S. Cl. ........................... 438/57; 257/66; 257/324; 257/344; 257/347; 257/408
(58) Field of Search .......................... 257/66, 324, 344, 257/347, 408

(56) References Cited

U.S. PATENT DOCUMENTS 5,841,692 A 11/1998 Gallagher et al.
6,593,624 B2 * 7/2003 Walker ........................ 257/344

OTHER PUBLICATIONS

R. Scheuerlein, et al., IEEE International Solid–State Circuits Conference, pp. 128–129, "TA 7.2 A 10NS Read and Write Non–Volatile Memory Array Using a Magnetic Tunnel Junction and FET Switch in Each Cell", 2000.
M. Sato, et al. IEEE Transactions on Magnetics, vol. 33, No. 5, pp. 3553–3555, "Spin–Valve–Like Properties and Annealing Effect in Ferromagnetic Tunnel Junctions", Sep. 1997.
M. Sato, et al., Jpn. J. Appl. Phys., vol. 36, part 2, No. 2B, pp. L200–L201, "Spin–Valve–Like Properties of Ferromagnetic Tunnel Junctions", Feb. 15, 1997.
K. Inomata, et al., Jpn. J. Appl. Phys., vol. 36, part 2, No. 10B, pp. L1380–L1383, "Spin–Dependent Tunneling Between a Soft Ferromagnetic Layer and Hard Magnetic Nanosize Particles", Oct. 15, 1997.

* cited by examiner

Primary Examiner—David Nelms
Assistant Examiner—Mai-Huong Tran
(74) Attorney, Agent, or Firm—Oblon, Spivak, McClelland, Maier & Neustadt, P.C.

(57) ABSTRACT

A magnetic memory device includes a memory cell portion, a peripheral circuit portion positioned in the vicinity of the memory cell portion, a plurality of first magnetoresistive effect elements which are arranged in the memory cell portion and function as memory elements, and a plurality of second magnetoresistive effect elements which are arranged in at least a part of the peripheral circuit portion and function as dummies, wherein a sum total of occupying areas of the second magnetoresistive effect elements is 5% to 80% of the peripheral circuit portion.

11 Claims, 14 Drawing Sheets

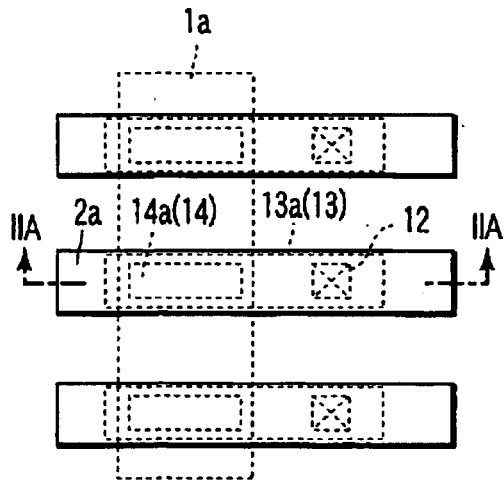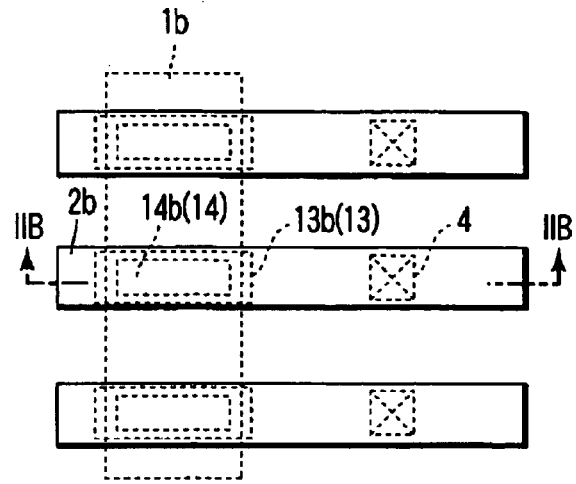
FIG. 1A  FIG. 1B
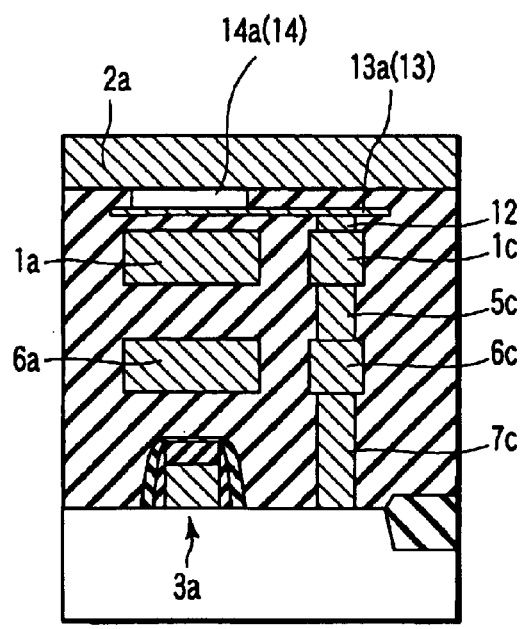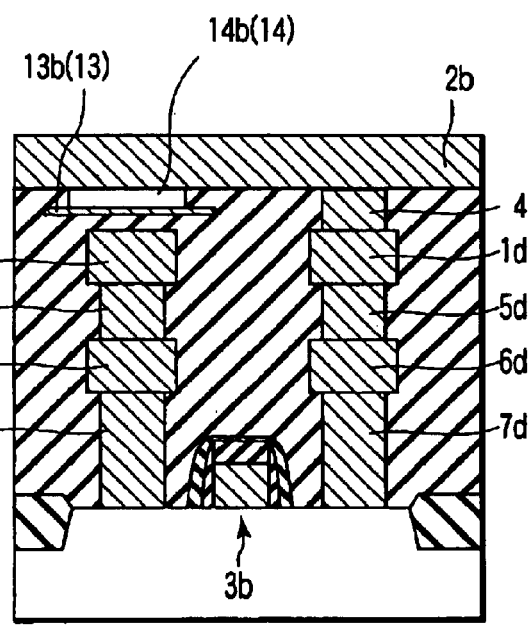
FIG. 2A  FIG. 2B

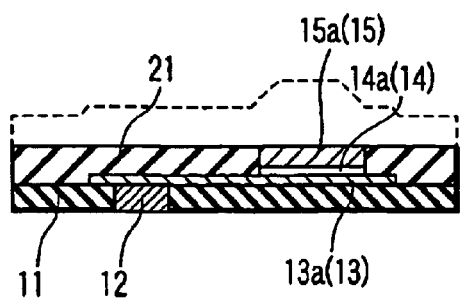
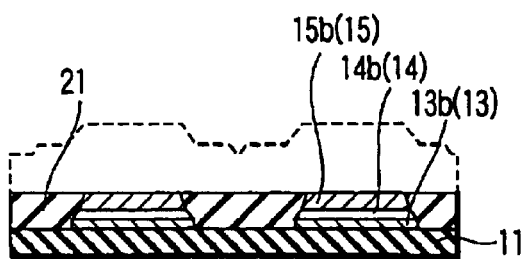
FIG. 13A            FIG. 13B
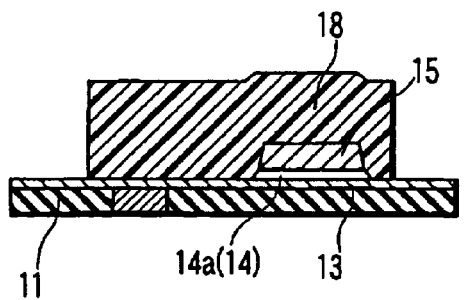
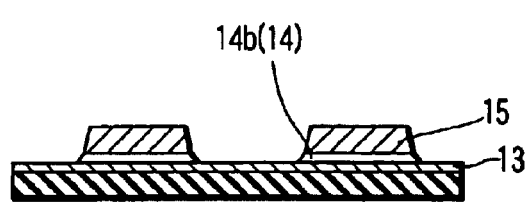
FIG. 14A            FIG. 14B
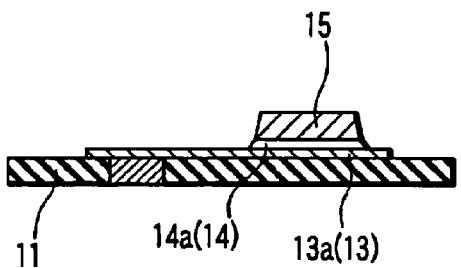
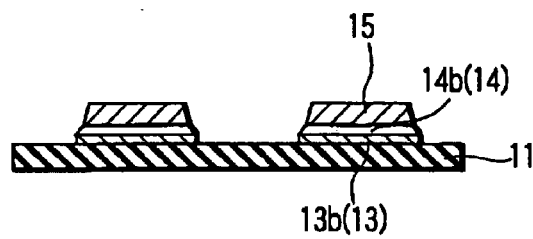
FIG. 15A            FIG. 15B
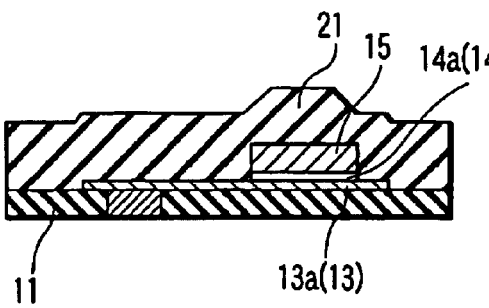
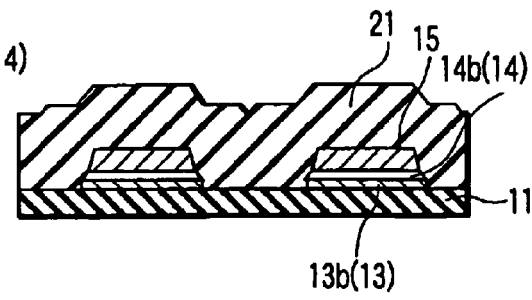
FIG. 16A            FIG. 16B

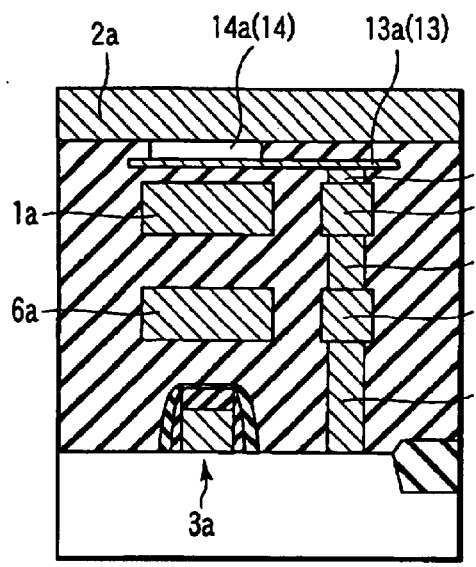 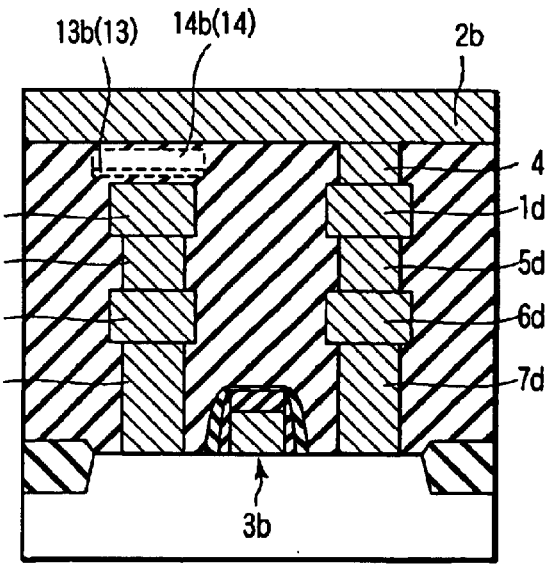
F I G. 19A     F I G. 19B
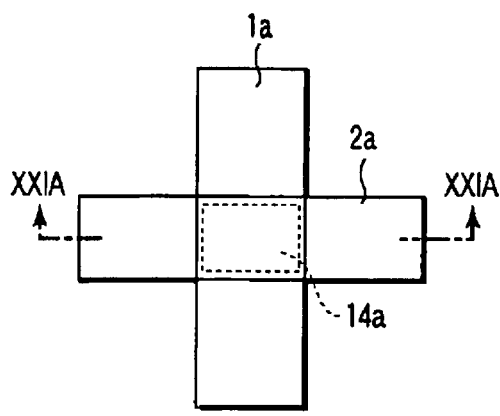 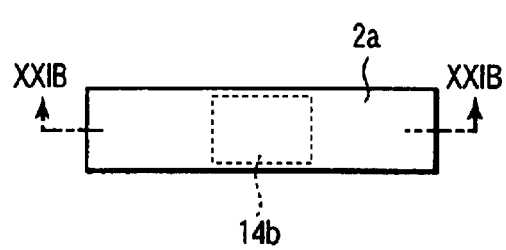
F I G. 20A     F I G. 20B
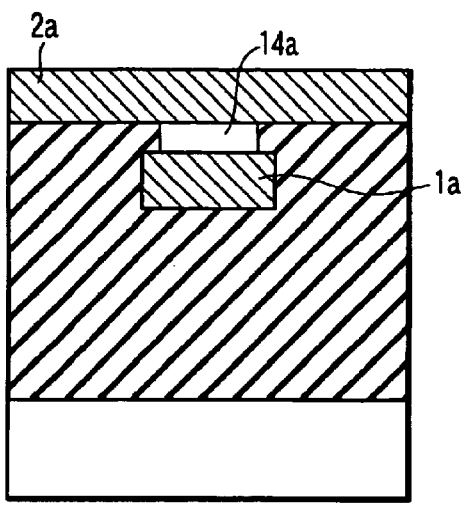 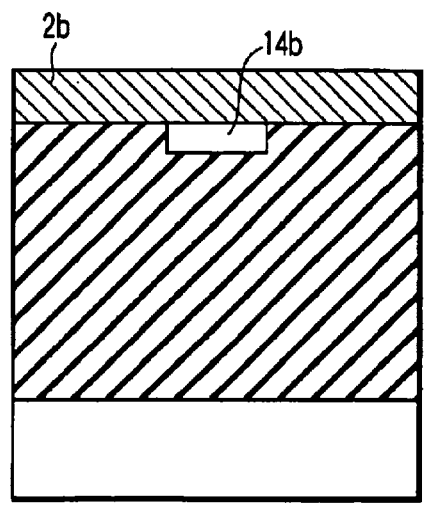
F I G. 21A     F I G. 21B

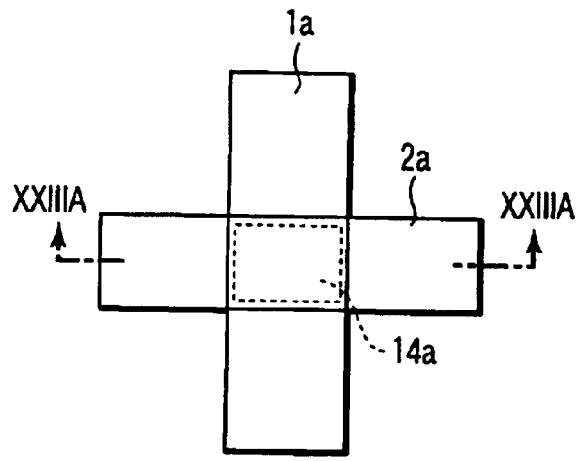
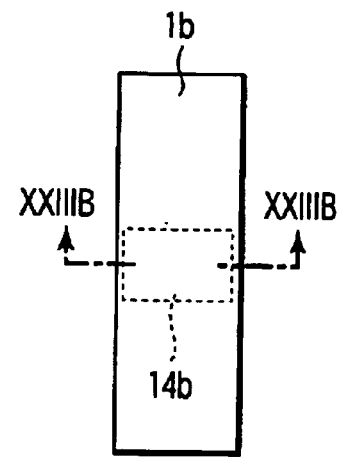
F I G. 22A  F I G. 22B
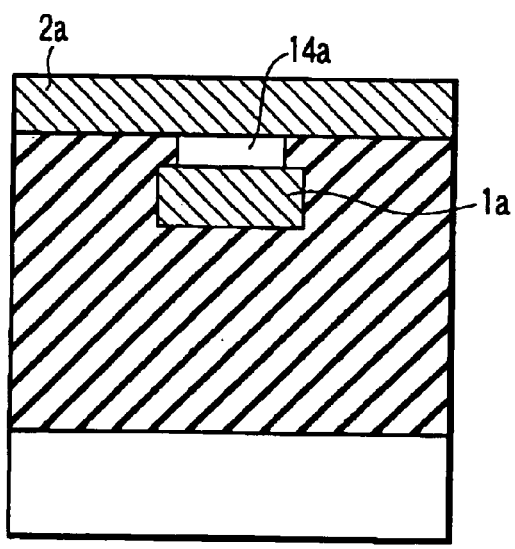
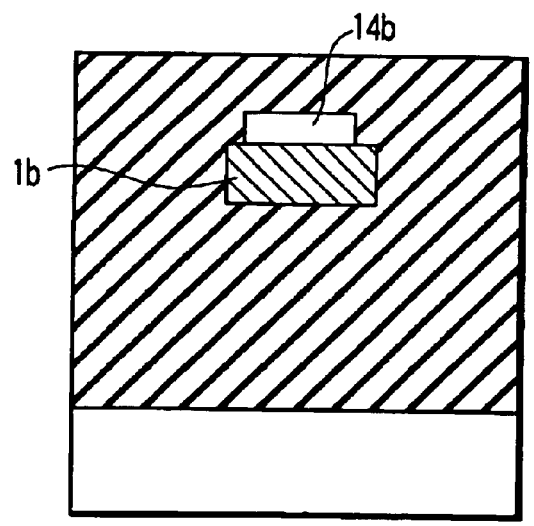
F I G. 23A  F I G. 23B

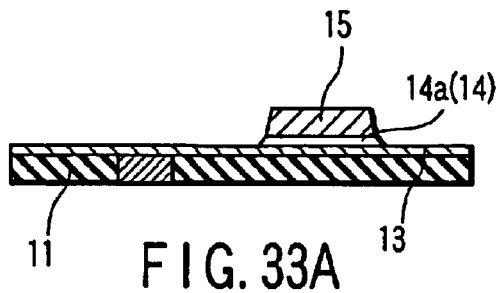
FIG. 33A
PRIOR ART
FIG. 33B
PRIOR ART
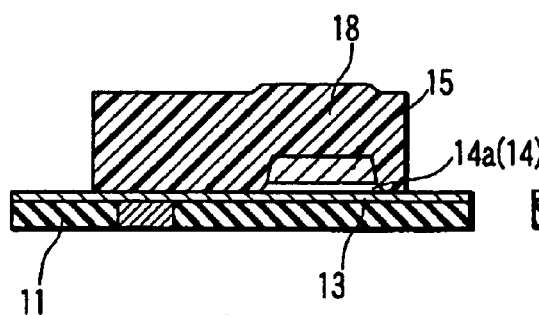
FIG. 34A
PRIOR ART
FIG. 34B
PRIOR ART
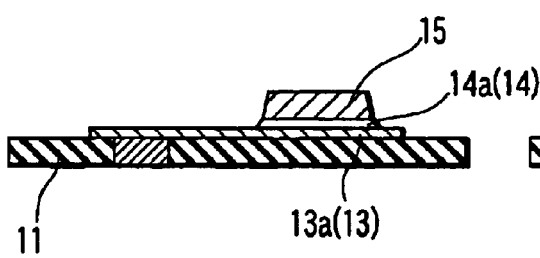
FIG. 35A
PRIOR ART
FIG. 35B
PRIOR ART

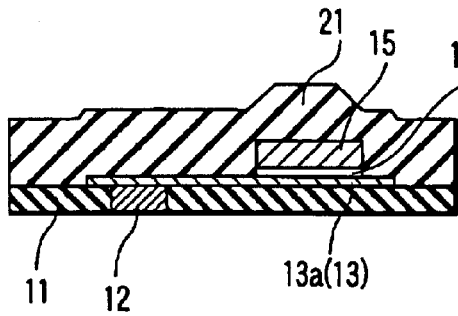
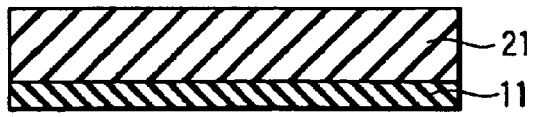
FIG. 36A PRIOR ART   FIG. 36B PRIOR ART
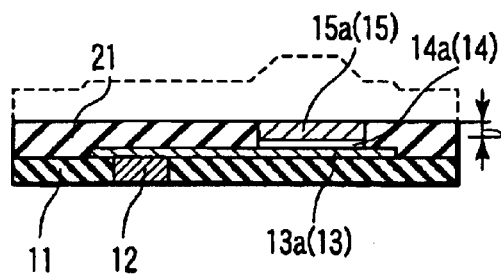
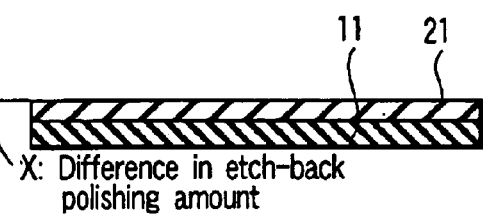
FIG. 37A PRIOR ART   FIG. 37B PRIOR ART
X: Difference in etch-back polishing amount
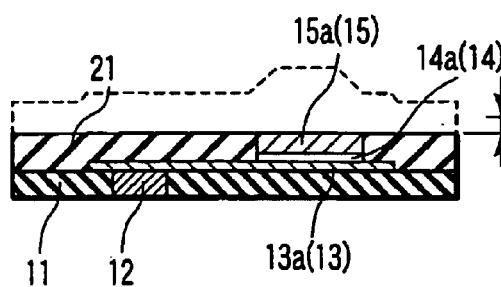
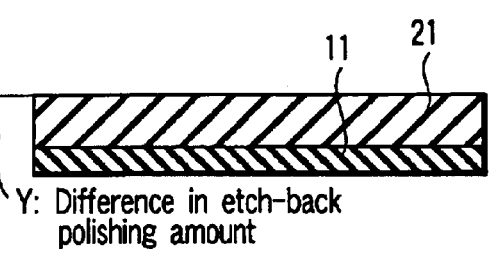
Y: Difference in etch-back polishing amount
FIG. 38A PRIOR ART   FIG. 38B PRIOR ART

MAGNETIC STORAGE APPARATUS HAVING DUMMY MAGNETORESISTIVE EFFECT ELEMENT AND MANUFACTURING METHOD THEREOF

CROSS-REFERENCE TO RELATED APPLICATIONS

This application is a division of and claims the benefit of priority under 35 USC §120 from U.S. Ser. No. 10/406,387, filed Apr. 4, 2003, and is based upon and claims the benefit of priority under 35 USC §119 from Japanese Patent Applications No. 2002-104388, filed Apr. 5, 2002; and No. 2003-072216, filed Mar. 17, 2003, the entire contents of which are incorporated herein by reference.

BACKGROUND OF THE INVENTION

1. Field of the Invention

The present invention relates to an information reproduction technique using a ferromagnetic material, and more particularly to a magnetic memory device utilizing a magnetoresistive effect element and a manufacturing method thereof.

2. Description of the Related Art

A magnetic random access memory (which will be abbreviated to an MRAM hereinafter) is a generic designation of solid-state memories which utilize a magnetization direction of a ferromagnetic material as a recording medium for information and are capable of rewriting, holding and reading recorded information at any time.

A memory cell of the MRAM usually has a structure in which a plurality of ferromagnetic materials are superimposed. Information is recorded by parallelizing or antiparallelizing the relative arrangement of magnetization of a plurality of ferromagnetic materials constituting the memory cell, and associating the parallel or anti-parallel state with binary information "1" or "0". Recorded information is written by passing a current to write lines arranged in the form of cross strips, and reversing the magnetization direction of the ferromagnetic materials in each cell. It is a non-volatile memory that power consumption when holding recorded information is zero in theory and recorded information is held even if a power supply is turned off. On the other hand, recorded information is read by utilizing a phenomenon that an electrical resistance of the memory cell varies depending on a relative angle between the magnetization direction of the ferromagnetic materials constituting the cell and a sense current or a relative angle of magnetization between a plurality of ferromagnetic layers, which is a so-called magnetoresistive effect.

Comparing functions of the MRAM with functions of a conventional semiconductor memory using a dielectric substance, the MRAM has many advantages. That is, for example, (1) the MRAM is completely non-volatile and rewriting for $10^{15}$ times or more is possible, (2) nondestructive reading is enabled and a refresh operation is not required, thereby shortening a read cycle, and (3) the resistance against radiation rays is strong as compared with a charge storage type memory cell, and others. It is predicted that a degree of integration per unit area and write and read times of the MRAM can be roughly the same as those of a DRAM. Exploiting the great characteristic of non-volatility, therefore, application to an external memory device for a portable device, a use with an LSI and a main storage memory in a personal computer is expected.

At present, the MRAM which has been examined to be put into practical use employs an element which demonstrates a tunneling magnetoresistive effect (which will be abbreviated to a TMR effect hereunder) for the memory cell (for example, see a non-patent cited reference 1). The element demonstrating the TMR effect (which will be referred to as an MTJ (Magnetic Tunneling Junction) element hereinafter) is mainly formed by a three-layer structure consisting of a ferromagnetic layer/an insulating layer/a ferromagnetic layer, and a current flows with the insulating layer being tunneled. A tunnel resistance value varies in proportion to a cosine of a relative angle of magnetizations of the both ferromagnetic metal layers, and takes a local maximum value when the both magnetizations are anti-parallel. At a tunnel junction consisting of, e.g., NiFe/Co/$Al_2O_3$/Co/NiFe, a magnetoresistive change ratio exceeding 25% is found in a low magnetic field not more than 50 Oe (see, e.g., a non-patent cited reference 2). As a structure of the MTJ element, there are known a so-called spin valve structure in which an antiferromagnetic material is arranged in contiguity with one ferromagnetic material and the magnetization directions are fixed for the purpose of improving the field sensitivity (see, e.g., a non-patent cited reference 3), and a structure that a double tunnel barrier is provided in order to improve the bias dependence of a magnetoresistive change rate (see, e.g., a non-patent cited reference 4).

When applying the MTJ element to the MRAM, electrodes at both ends of the MTJ element must be connected to data lines and an external circuit such as a selection transistor or the like. In particular, since the MTJ element has a vertical structure, the element separation must be carried out by using the insulating film when connecting the upper electrode on the MTJ element to an external wiring. As this insulating film, a contact hole for wiring connection is formed. As a method of forming the contact hole, there are mainly used two methods, i.e., (1) a method of using a resist mask and etching the insulating film by reactive chemical etching or the like, and (2) a method of forming the insulating film while leaving a resist used in element processing and then peeling the resist by using a solvent or the like (self-alignment process).

The method (1), however, has a drawback that a mask alignment margin in the above-described process defines a minimum processing dimension and it is difficult to realize minuteness, and other drawbacks. Further, the method (2) has a disadvantage that peeling of the resist is difficult when realization of minuteness advances and a thickness of the photoresist becomes approximately equal to an element dimension. It is to be noted that a patent cited reference 1 discloses a method of depositing an insulating film on the entire surface after processing the element, then performing etch-back to the element surface and opening the contact in the self-alignment manner as a manufacturing method realized by improving the method (2).

[Non-Patent Cited Reference 1]

Roy Scheuerlein, et al., A 10 ns Read and Write Non-Volatile Memory Array Using a Magnetic Tunnel Junction and FET Switch in each cell, "2000 ISSCC Digest of Technical Papers", (USA), February 2000, p. 128–129

[Non-Patent Cited Reference 2]

M Sato, et al., Spin-Valve-Like Properties and Annealing Effect in Ferromagnetic Tunnel Junctions, "IEEE Trans. Mag.", (USA), 1997, Vol. 33, No. 5, p. 3553–3555

[Non-Patent Cited Reference 3]

M Sato, et al., Spin-Valve-Like Properties of Ferromagnetic Tunnel Junctions, "Jpn. J. Appl. Phys", 1997, Vol. 36, Part 2, p. 200–201

[Non-Patent Cited Reference 4]

K Inomata, et al., Spin-dependent tunneling between a soft ferromagnetic layer and hard magnetic nano particles, "Jpn. J. Appl. Phys.", 1997, Vol. 36, Part 2, p. 1380–1383

[Patent Cited Reference 1]

Specification of U.S. Pat. No. 5,841,692

A concrete example when the MTJ element is applied to the MRAM will now be described with reference to the accompanying drawings.

FIG. 27A is a plane view showing a magnetic memory device according to a prior art. FIG. 27B is a cross-sectional view of the magnetic memory device taken along the line XXVIIB—XXVIIB in FIG. 27A. FIGS. 28A and 28B are cross-sectional views of a magnetic memory device including a memory cell portion (which will be referred to as a cell portion hereinafter) of the magnetic memory device according to the prior art and a peripheral circuit portion (which will be referred to as a core portion hereinafter) of the magnetic memory device. In the cell portion, as shown in FIG. 28A, a magnetoresistive effect element 14a is arranged on a lower metal layer 13a, and the magnetoresistive effect element 14a is connected to a selection transistor 3a through the lower metal layer 13a and a contact 12. On the other hand, a magnetoresistive effect element and a lower metal layer are not formed in the core portion as shown in FIG. 28B.

FIGS. 29A and 29B to FIGS. 38A and 38B show a method of manufacturing a cell portion and a core portion of a magnetic memory device illustrated in FIGS. 28A and 28B. Here, the respective figures A show the cell portion in the magnetic memory device, and the respective figures B show the core portion in the magnetic memory device. A method of manufacturing the memory device according to the prior art will now be described. It is to be noted that description will be first given as to a process after forming a lower contact 12 in a first insulating film 11.

As shown in FIGS. 29A and 29B, a lower metal layer 13 is first formed on a first insulating film 11 in common with the cell portion and the core portion, and a magnetoresistive effect film 14 is formed on the lower metal layer 13. Then, first and second hard masks 15 and 16 are superimposed on the magnetoresistive effect film 14. Here, the first hard mask 15 consists of, e.g., a conductive film, and the second hard mask 16 is made up of, e.g., a non-conductive film.

Then, as shown in FIGS. 30A and 30B, the second hard mask 16 is selectively etched in common with the cell portion and the core portion. As a result, the second hard mask 16 to which a shape of the magnetoresistive effect element has been transferred remains in the cell portion, but the second hard mask 16 is all removed in the core portion.

Subsequently, as shown in FIGS. 31A and 31B, the first hard mask 15 is etched in common with the cell portion and the core portion. As a result, since etching is effected by using the second hard mask 16, the first hard mask 15 to which a shape of the magnetoresistive effect element has been transferred remains in the cell portion, but the first hard mask 15 is all removed in the core portion.

Thereafter, as shown in FIGS. 32A and 32B, the second hard mask 16 is peeled in the cell portion.

Then, as shown in FIGS. 33A and 33B, in common with the cell portion and the core portion, a magnetoresistive effect film 14 is etched. Consequently, since etching is effected by using the first hard mask 15, a magnetoresistive effect element 14a consisting of the magnetoresistive effect film 14 is formed in the cell portion, and the magnetoresistive effect film 14 is all removed in the core portion.

Subsequently, as shown in FIGS. 34A and 34B, in common with the cell portion and the core portion, a photoresist 18 is applied and patterned. As a result, the photoresist 18 patterned into a shape of the lower metal layer 13 remains in the cell portion, but the photoresist 18 is all removed in the core portion.

Next, as shown in FIGS. 35A and 35B, in common with the cell portion and the core portion, the lower metal layer 13 is etched. Consequently, since etching is effected by using the photoresist 18, the patterned lower metal layer 13 remains in the cell portion, but the lower metal layer 13 is all removed in the core portion. Thereafter, the photoresist 18 is removed in the cell portion.

Then, as shown in FIGS. 36A and 36B, in common with the cell portion and the core portion, a second insulating film 21 is formed on the entire surface.

Subsequently, as shown in FIGS. 37A and 37B, the second insulating film 21 in each of the cell portion and the core portion is etched back by using, e.g., chemical mechanical polish (which will be abbreviated to CMP hereinafter). As a result, in the cell portion, the surface of a contact 15a consisting of the first hard mask 15 is exposed, and a contact is opened in the self-alignment manner.

In the above-described prior art process, however, when etch-back is carried out after forming the second insulating film 21, the following problems occur.

As apparent from FIGS. 36A and 36B, although the lower metal layer 13, the magnetoresistive effect element 14a and the first hard mask 15 exist in the cell portion, these patterns do not exist in the core portion. Therefore, since the cell portion and the core portion are different from each other in unevenly pattern density (which will be abbreviated to flatness hereinafter), there occurs a difference in a polishing speed between the cell portion and the core portion when etching back the second insulating film 21.

As described above, since the polishing speed of CMP varies depending on the flatness, the second insulating film 21 in the core portion may remain with a small thickness (see FIG. 37B) or a large thickness (see FIG. 38B) in some cases as compared with the second insulating film 21 in the cell portion.

In particular, as shown in FIGS. 37A and 37B, when the insulating film 21 becomes thin in the core portion as compared with the cell portion, the lower wiring (not shown) may be exposed in some cases, which provokes a problem of the short circuit and the like of the wiring.

Further, in the conventional process, there is no appropriate end point detection method with respect to etch-back. In case of CMP, since the polishing speed is lower with a slurry and under polishing conditions used in polishing of the second insulating film 21, an end point can be detected by using known end point detecting means such as stress detection based on the first hard mask 15 consisting of a metal on the magnetoresistive effect element 14a. However, since the first hard mask 15 exists only in the cell portion, its area occupying in the whole is small, and hence the end point detection sensitivity is deteriorated. As a result, since the polishing speed varies in the cell portion in which the surface of the hard mask 15 is exposed, it can be expected that a large difference in a polishing quantity can be generated between the cell portion and the core portion.

Although description has been given herein as to the method of exposing the contact 15a by using CMP, unevenness of the contact exposure or difficulty in detecting an end point which relies on the original flatness is involved even in, e.g., a method of etching back the entire surface after flattening the whole by using the flattening film, and the same problem as that in case of CMP occurs.

BRIEF SUMMARY OF THE INVENTION

According to a first aspect of the present invention, there is provided a magnetic memory device comprising: a memory cell portion; a peripheral circuit portion positioned in the vicinity of the memory cell portion; a plurality of first magnetoresistive effect elements which are arranged in the memory cell portion and function as memory elements; and a plurality of second magnetoresistive effect elements which are arranged in at least a part of the peripheral circuit portion and function as dummies, wherein a sum total of occupying areas of the second magnetoresistive effect elements is 5% to 80% of the peripheral circuit portion.

According to a second aspect of the present invention, there is provided a manufacturing method of a magnetic memory device, which is a manufacturing method of a magnetic memory device having a memory cell portion and a peripheral circuit portion, comprising: forming a first metal material film in each of the memory cell portion and the peripheral circuit portion; forming a magnetoresistive effect film on the first metal material film in each of the memory cell portion and the peripheral circuit portion; forming a cap film on the magnetoresistive effect film in each of the memory cell portion and the peripheral circuit portion; forming a first cap layer by patterning the cap film of the memory cell portion into a first shape, and forming a second cap layer by patterning the cap film of the peripheral circuit portion into a second shape; forming a first magnetoresistive effect element which functions as a memory element by patterning the magnetoresistive effect film of the memory cell portion into the first shape by using the first cap layer, and forming a second magnetoresistive effect element which functions as a dummy by patterning the magnetoresistive effect film of the peripheral circuit portion into the second shape by using the second cap layer; forming a first metal layer by patterning the first metal material film of the memory cell portion into a third shape, and forming a second metal layer by patterning the first metal material film of the peripheral circuit portion into a fourth shape; forming a first insulating film on the first and second cap layers and the first and second metal layers in each of the memory cell portion and the peripheral circuit portion; flattening the first insulating film; and removing the first insulating film until a surface of the first cap layer is exposed.

BRIEF DESCRIPTION OF THE SEVERAL VIEWS OF THE DRAWING

FIG. 1A is a plane view showing a cell portion in a magnetic memory device according to a first embodiment of the present invention;

FIG. 1B is a plane view showing a core portion of the magnetic memory device according to the first embodiment of the present invention;

FIG. 2A is a cross-sectional view showing the magnetic memory device taken long the line IIA—IIA in FIG. 1A;

FIG. 2B is a cross-sectional view showing the magnetic memory device taken along the line IIB—IIB in FIG. 1B;

FIGS. 13A, 14A, 15A and 16A are cross-sectional views showing a cell portion in a magnetic memory device according to a second embodiment of the present invention;

FIGS. 13B, 14B, 15B and 16B are cross-sectional views showing a core portion in the magnetic memory device according to the second embodiment of the present invention;

FIG. 19A is a cross-sectional view showing the magnetic memory device taken along the line XIXA—XIXA in FIG. 18A;

FIG. 19B is a cross-sectional view showing the magnetic memory device taken along the line XIXB—XIXB in FIG. 18B;

FIG. 20A is a plane view showing a cell portion in a magnetic memory device according to a fourth embodiment of the present invention;

FIG. 20B is a plane view showing a core portion in the magnetic memory device according to the fourth embodiment of the present invention;

FIG. 21A is a cross-sectional view showing the magnetic memory device taken along the line XXIA—XXIA in FIG. 20A;

FIG. 21B is a cross-sectional view showing the magnetic memory device taken along the line XXIB—XXIB in FIG. 20B;

FIG. 22A is a plane view showing a cell portion in another magnetic memory device according to the fourth embodiment of the present invention;

FIG. 22B is a plane view showing a core portion in another magnetic memory device according to the fourth embodiment of the present invention;

FIG. 23A is a cross-sectional view showing another magnetic memory device taken along the line XXIIIA—XXIIIA in FIG. 22A;

FIG. 23B is a cross-sectional view showing another magnetic memory device taken along the line XXIIIB—XXIIIB in FIG. 22B;

FIGS. 29A, 30A, 31A, 32A, 33A, 34A, 35A, 36A and 37A are cross-sectional views showing manufacturing processes of the cell portion in the magnetic memory device according to the prior art;

FIGS. 29B, 30B, 31B, 32B, 33B, 34B, 35B, 36B and 37B are cross-sectional views showing manufacturing processes of the core portion in the magnetic memory device according to the prior art;

FIG. 38A is a cross-sectional view showing another manufacturing process of the cell portion in the is magnetic memory device according to the prior art; and FIG. 38B is a cross-sectional view showing another manufacturing process of the core portion in the magnetic memory device according to the prior art.

DETAILED DESCRIPTION OF THE INVENTION

Figure 3A:
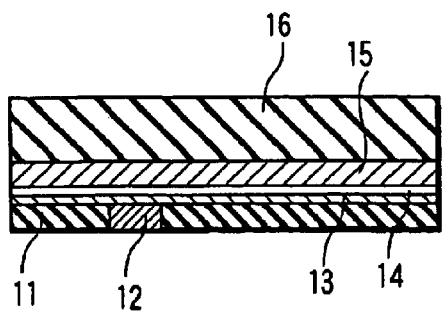
FIGS. 3A, 4A, 5A, 6A, 7A, 8A, 9A, 10A and 11A are cross-sectional views showing processes of manufacturing the cell portion in the magnetic memory device according to the first embodiment of the present invention.

Preferred embodiments according to the present invention will now be described hereinafter with reference to the accompanying drawings. In this description, like reference numerals denote like or corresponding parts throughout the drawings.

In each embodiment according to the present invention, a dummy magnetoresistive effect element is provided in an area where a pattern covering ratio of a conventional structure is low. It is to be noted that a term "pattern covering ratio" used herein is defined by a percentage of an area where the magnetoresistive effect element exists in a surface including the magnetoresistive effect element with respect to the predetermined area. In addition, the dummy magnetoresistive effect element means an element which is not used as a data memory.

In each embodiment according to the present invention, a memory cell portion (which will be referred to as a cell portion hereinafter) in a magnetic memory device is taken as an example of an area with a high pattern covering ratio, and a peripheral circuit portion (which will be referred to as a core portion hereinafter) in the magnetic memory device is taken as an example of an area with a low pattern covering ratio. However, the area discussed about pattern covering ratio is not restricted to the cell portion and the core portion. For example, a test circuit portion or the like required for a product test can be a target to be judged based on the above-described concept depending on the pattern covering ratio of the portion. It is to be noted that an area in which a dummy magnetoresistive effect element is provided will be described in connection with a fifth embodiment.

[First Embodiment]

In the first embodiment, like the cell portion, a dummy magnetoresistive effect element and a lower metal layer are formed in the core portion.

FIGS. 1A and 1B are plane views showing a magnetic memory device according to the first embodiment of the present invention. FIG. 2A is a cross-sectional view showing the magnetic memory device taken along the line IIA—IIA in FIG. 1A. FIG. 2B is a cross-sectional view showing the magnetic memory device taken long the line IIB—IIB in FIG. 1B. Here, FIGS. 1A and 2A show the cell portion in the magnetic memory device, and FIGS. 1B and 2B show the core portion in the magnetic memory device.

As shown in FIGS. 1A and 1B and FIGS. 2A and 2B, in the magnetic memory device according to the first embodiment, like the cell portion, a dummy magnetoresistive effect element 14b and a dummy lower metal layer 13b are formed in the core portion.

That is, in the cell portion, a magnetoresistive effect element 14a used as a memory element is arranged at an intersection of a first write line (word line) 1a and a second write line (bit line) 2a, and this magnetoresistive effect element 14a is connected to an MOS transistor 3a through contacts 12, 5c and 7c and wirings 1c and 6c.

Further, in the core portion, a first wiring 1b is formed on the same surface as the first write line 1a, a second wiring 2b is formed on the same surface as the second write line 2a, the dummy magnetoresistive effect element 14b is formed on the same surface as the magnetoresistive effect element 14a, and the dummy lower metal layer 13b is formed on the same surface as the lower metal layer 13a. Furthermore, the second wiring 2b is connected to an MOS transistor 3b through contacts 4, 5d and 7d and wirings 1d and 6d.

It is to be noted that the wiring 1c formed on the same surface as the first write line 1a is electrically connected with the lower metal layer 13a in the cell portion, but a contact connecting the lower metal layer 13b with the first wiring 1b is not formed in the core portion even if the magnetoresistive effect element 14b and the lower metal layer 13b are formed as dummies, and hence the lower metal layer 13b and the first wiring 1b are electrically insulated from each other, which will not result in a big problem.

FIGS. 3A and 3B to FIGS. 11A and 11B are cross-sectional views showing manufacturing processes of the magnetic memory device according to the first embodiment of the present invention. The respective figures A show the cell portion in the magnetic memory device, and the respective figures B show the core portion in the magnetic memory device. A manufacturing method of the magnetic memory device according to the first embodiment will now be described hereinafter. It is to be noted that description will start from a process after forming the first write line (not shown) or a lower contact 12 in a first insulating film 11.

Figure 3B:
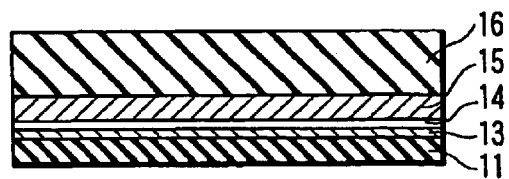
FIGS. 3B, 4B, 5B, 6B, 7B, 8B, 9B, 10B and 11B are cross-sectional views showing processes of manufacturing the core portion in the magnetic memory device according to the first embodiment of the present invention.

First, as shown in FIGS. 3A and 3B, in common with the cell portion and the core portion, a lower metal layer 13 is formed on the first insulating film 11, and a magnetoresistive effect film 14 is formed on the lower metal layer 13. Moreover, two layers, i.e., first and second hard masks 15 and 16 are superimposed on the magnetoresistive effect film 14. Here, the first hard mask 15 consists of, e.g., a conductive film, and the second hard mask 16 consists of, e.g., a non-conductive film.

Figure 4A:
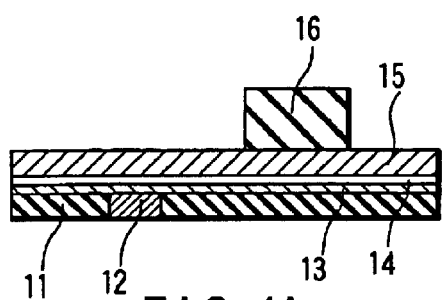
Figure 4B:
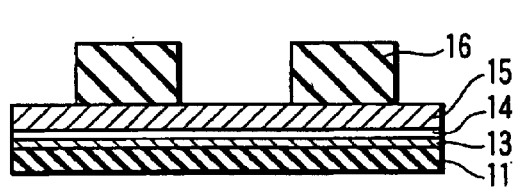

Then, as shown in FIGS. 4A and 4B, in common with the cell portion and the core portion, the second hard mask 16 is selectively etched, and a shape of the magnetoresistive effect element is transferred to the second hard mask 16.

Figure 5A:
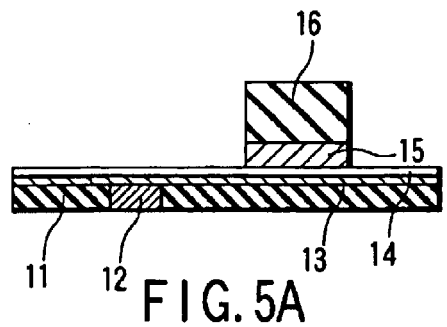
Figure 5B:
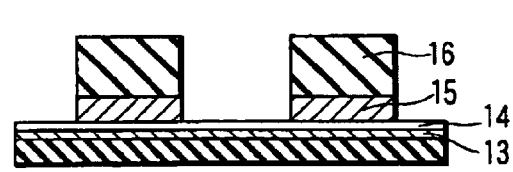

Subsequently, as shown in FIGS. 5A and 5B, in common with the cell portion and the core portion, the second hard mask 16 is used to etch the first hard mask 15, and a shape of the magnetoresistive effect element is transferred to the first hard mask 15.

Figure 6A:
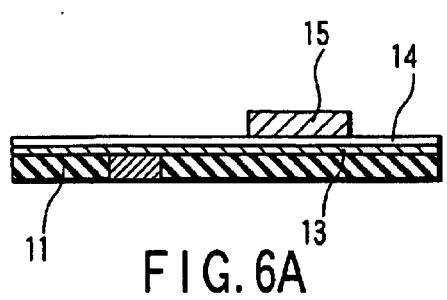
Figure 6B:
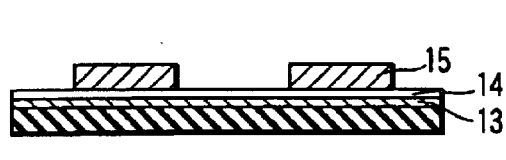

Thereafter, as shown in FIGS. 6A and 6B, in common with the cell portion and the core portion, the second hard mask 16 is peeled off.

Figure 7A:
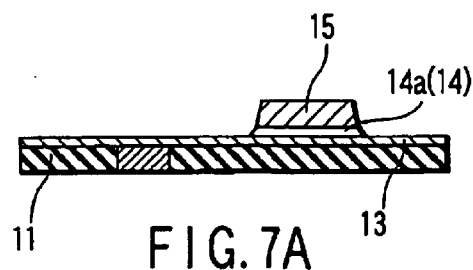
Figure 7B:
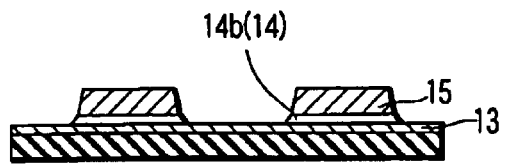

Then, as shown in FIGS. 7A and 7B, in common with the cell portion and the core portion, the first hard mask 15 is used to etch the magnetoresistive effect film 14. As a result, a magnetoresistive effect element 14a consisting of the magnetoresistive effect film 14 is formed in the cell portion, and a dummy magnetoresistive effect element 14b consisting of the magnetoresistive effect film 14 is formed in the core portion.

Figure 8A:
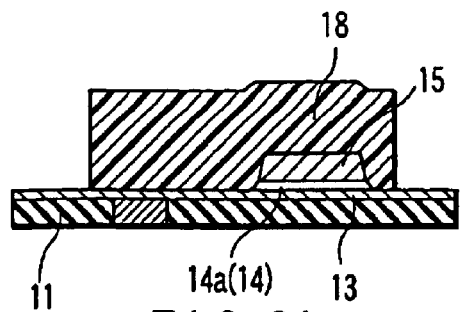
Figure 8B:
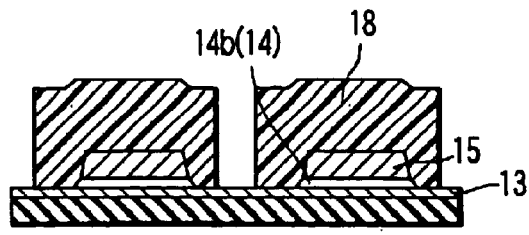

Subsequently, as shown in FIGS. 8A and 8B, in common with the cell portion and the core portion, a photoresist 18 is applied, and it is patterned into each of shapes of the lower metal layers 13a and 13b.

Figure 9A:
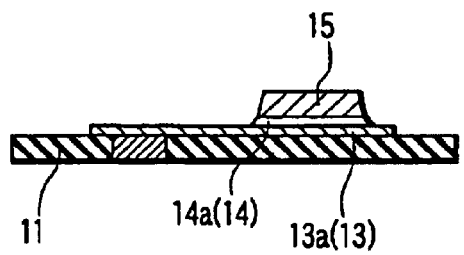
Figure 9B:
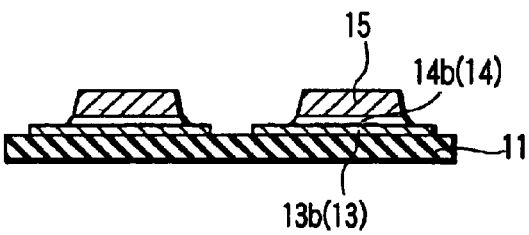

Then, as shown in FIGS. 9A and 9B, in common with the cell portion and the core portion, the patterned photoresist 18 is used to etch the lower metal layer 13. As a result, a lower metal layer 13a separated for each cell is formed in the cell portion, and a dummy lower metal layer 13b is formed in the core portion. Thereafter, the photoresist 18 is peeled off.

Figure 10A:
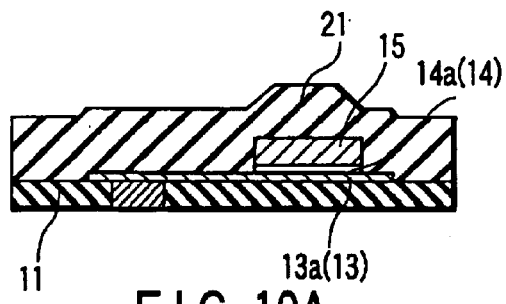
Figure 10B:
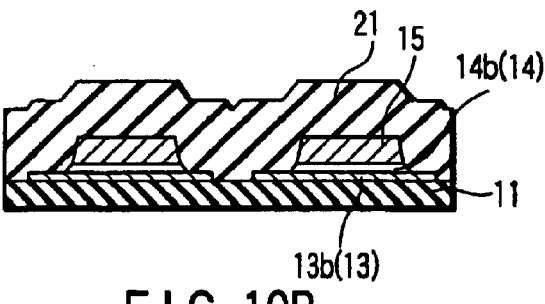

Subsequently, as shown in FIGS. 10A and 10B, in common with the cell portion and the core portion, a second insulating film 21 is formed on the first insulating film 11, the lower metal layers 13a and 13b and the first hard mask 15.

Figure 11A:
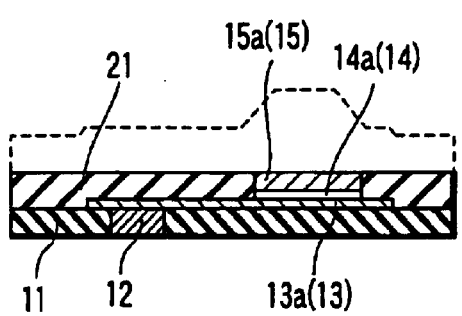
Figure 11B:
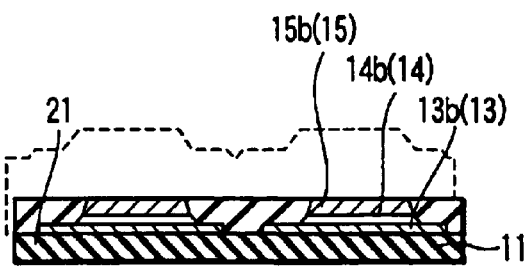

Then, as shown in FIGS. 11A and 11B, in common with the cell portion and the core portion, the second insulating film 21 is etched back by using chemical mechanical polish (which will be abbreviated to CMP hereinafter) reaching to the first hard mask 15. As a result, surfaces of contacts 15a and 15b consisting of the first hard mask 15 are exposed, i.e., contacts are opened in the self-alignment manner. Here, the contacts 15a and 15b consisting of the first hard mask 15 have approximately the same shapes as those of the magnetoresistive effect elements 14a and 14b. Thereafter, the second write line (not shown) is formed on the second insulating film 21 and the contacts 15a and 15b.

Although description has been given herein as to the self-alignment contact formation using CMP, there is also a method of performing the self-alignment contact formation by etching back the second insulating film 21 using RIE (reactive ion etching), and this method is carried out in the following manner. First, the flattening film or a similar chemical agent is applied on the entire surface in advance, and a flat surface is formed. Then, the contacts 15a and 15b are exposed by etching back the entire surfaces of the flattening film and the second insulating film 21 based on RIE, thereby realizing the self-alignment contact opening. As a flattening film or a similar chemical agent, there are, e.g., a photosensitive resin, a non-photosensitive resin, organic glass (e.g., an SOG (spin on glass) film) and others, and a material having the thermosetting property can be used. At that time, the second insulating film 21 covering the magnetoresistive effect elements 14a and 14b and the flattening film or the similar chemical agent must have approximately equal etching speeds in this etching process.

Figure 12A:
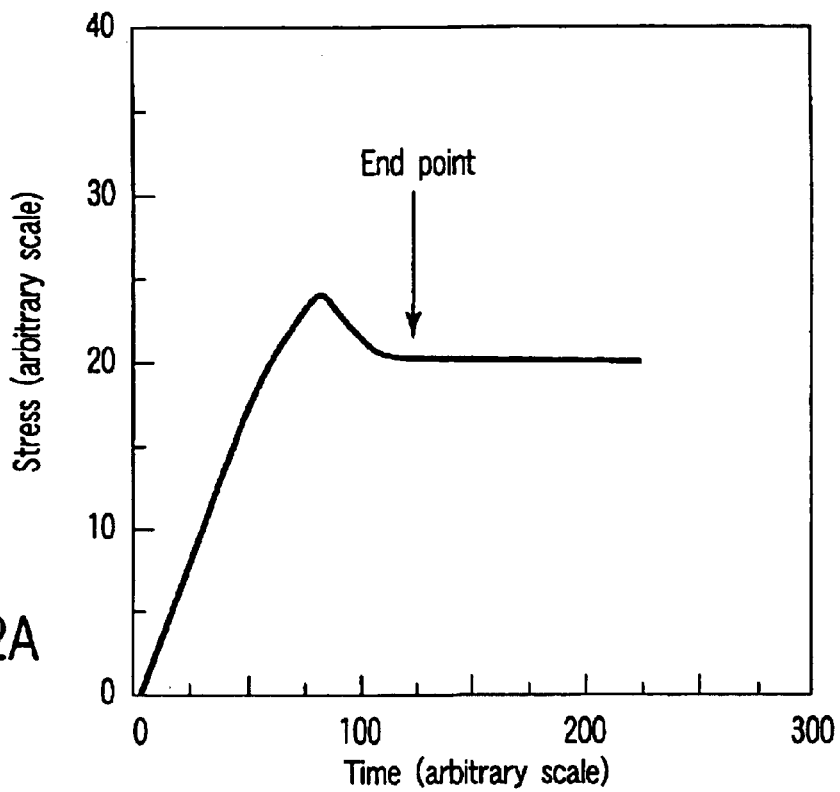
FIG. 12A is a view showing a change in stress at the time of etch-back according to the first embodiment of the present invention.
Figure 12B:
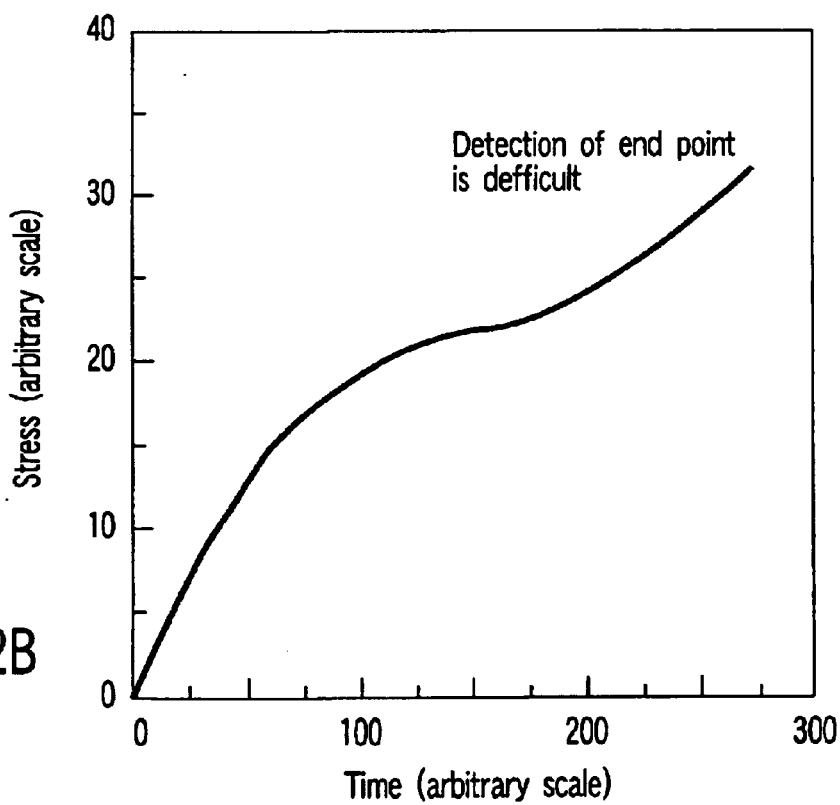
FIG. 12B is a view showing a change in stress at the time of etch-back according to a prior art.

According to the first embodiment, like the cell portion, the magnetoresistive effect element 14b and the lower metal layer 13b are also formed as in the core portion. As a result, the stress at the time of etch-back becomes constant when a given time is reached and hence detection of an end point is facilitated in the first embodiment (see FIG. 12A), whereas the stress at the time of etch-back monotonously increases with time and detection of an end point is hence difficult in the prior art (see FIG. 12B). Alternatively, in the self-alignment contact formation by using etch-back based on RIE, the detection accuracy in the luminescence monitor when the contact layer 15 is exposed can be likewise improved, and detection of an end point can be facilitated.

As described above, a difference in pattern covering ratio between the cell portion and the core portion can be reduced, thereby suppressing a difference in amount of etching at the time of etch-back.

[Second Embodiment]

In the second embodiment, since the lower metal layer in the core portion in the first embodiment is not patterned, and the lower metal layer in the core portion thereby has the same pattern as that of the magnetoresistive effect element.

FIGS. 13A and 13B are partial cross-sectional views showing a magnetic memory device according to the second embodiment of the present invention. FIG. 13A shows a cell portion in the magnetic memory device, and FIG. 13B shows a core portion in the magnetic memory device. Description will be given as to only a point different from the structure of the first embodiment.

As shown in FIGS. 13A and 13B, in the magnetic memory device according to the second embodiment, a difference from the first embodiment lies in that the plane shape of the lower metal layer 13b in the core portion has approximately the same shape as the plane shapes of the magnetoresistive effect element 14b and the first hard mask 15. That is because the lower metal layer 13 is patterned by using the resist mask in the cell portion but, at that time, the lower metal layer 13 which is not covered with the first hard mask 15 and the magnetoresistive effect element 14b is removed in the core portion because the resist mask does not exist and the first hard mask 15 functions as a patterning mask.

FIGS. 14A and 14B to FIGS. 16A and 16B are cross-sectional views showing manufacturing processes of the magnetic memory device according to the second embodiment of the present invention. A manufacturing method of the magnetic memory device according to the second embodiment will now be described hereinafter. Here, the same processes as those in the manufacturing method of the magnetic memory device according to the first embodiment will not be explained, and only different processes will be described.

First, as shown in FIGS. 3A and 3B to FIGS. 7A and 7B, like the first embodiment, a magnetoresistive effect element 14a consisting of a magnetoresistive effect film 14 is formed in the cell portion, and a dummy magnetoresistive effect element 14b consisting of the magnetoresistive effect film 14 is formed in the core portion.

Then, as shown in FIGS. 14A and 14B, in common with the cell portion and the core portion, a photoresist 18 is applied. Moreover, the photoresist 18 is patterned in such a manner that it remains only in the cell portion. At this moment, the photoresist 18 is patterned into a shape of the lower metal layer 13a separated for each cell.

Then, as shown in FIGS. 15A and 15B, in common with the cell portion and the core portion, the lower metal layer 13 is etched. At that time, in the cell portion, the photoresist 18 is used as a mask, and the lower metal layer 13a separated for each cell is formed. On the other hand, in the core portion, the first hard mask 15 is used as a mask, a lower metal layer 13b as a dummy which has a shape of the first hard mask 15 is formed, and a surface of the first hard mask 15 is slightly etched. Thereafter, the photoresist 18 in the cell portion is peeled off.

Then, as shown in FIGS. 16A and 16B, in common with the cell portion and the core portion, a second insulating film 21 is formed on the first insulating film 11, the lower metal layers 13a and 13b and the first hard mask 15.

Subsequently, as shown in FIGS. 13A and 13B, in common with the cell portion and the core portion, the second insulating film 21 is etched back by using RIE or CMP reaching to the first hard mask 15. As a result, surfaces of contacts 15a and 15b consisting of the first hard mask 15 are exposed, i.e., the contacts are opened in the self-alignment manner. Thereafter, the second write line (not shown) is formed on the second insulating film 21 and the contacts 15a and 15b.

It is to be noted that, in the process of patterning the lower metal layer 13 shown in FIGS. 15A and 15B, the lower metal layer 13 is etched and a part of the surface of the first hard mask 15 is removed in the core portion since the photoresist 18 does not remain. Therefore, the first hard mask 15 in the cell portion has a film thickness different from that in the core portion, and it can be considered that a difference in etch-back polishing amount is generated between the cell portion and the core portion in the process shown in FIGS. 13A and 13B. However, since a thickness of the first hard mask 15 is several-fold of that of the lower metal layer 13, it is set that a difference in etch-back polishing amount between the cell portion and the core portion consequently falls within a range of a required specification even though the manufacturing method like the second embodiment is used. In particular, as shown in FIG. 37B, a problem of reduction in thickness of the second insulating film 21 of the core portion can be sufficiently moderated even in a pattern such as described in connection with the second embodiment. Alternatively, after etching the first hard mask layer 15, the second hard mask 16 on the first hard mask layer 15 is not removed but saved, and the second hard mask 16 is removed after etching the lower metal layer 13. As a result, the thickness of the hard mask 15 in the cell portion can be maintained equal to that of the hard mask 15 in the core portion, thereby approximately eliminating a difference in an etch-back polishing amount.

According to the second embodiment, the same advantages as those in the first embodiment can be obtained.

[Third Embodiment]

In the third embodiment, an insulating layer is formed between the dummy magnetoresistive effect element and an upper layer wiring in the core portion according to the first embodiment.

Figure 17A:
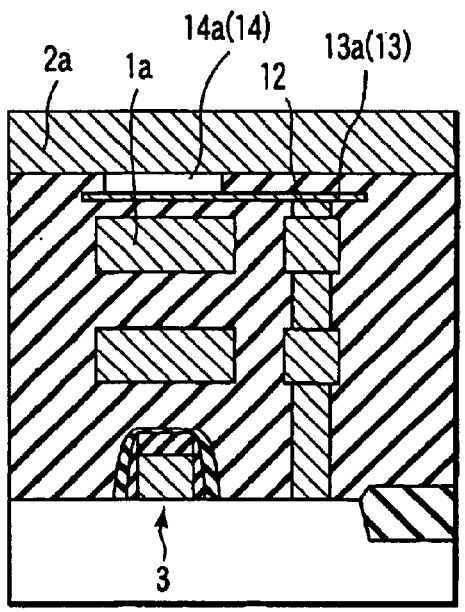
FIG. 17A is a cross-sectional view showing a cell portion in a magnetic memory device according to a third embodiment of the present invention.
Figure 17B:
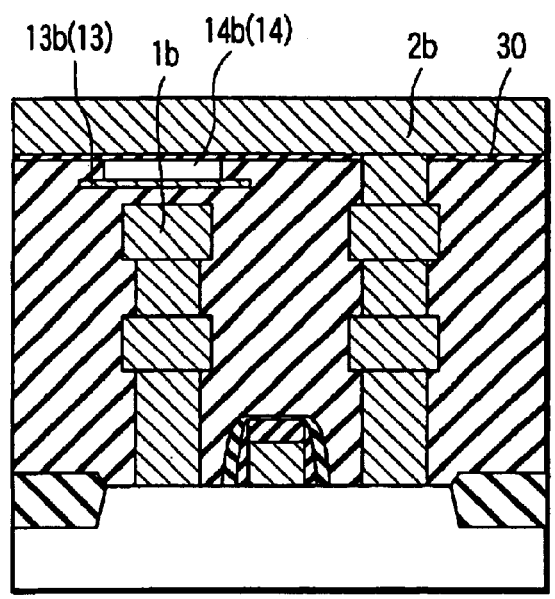
FIG. 17B is a cross-sectional view showing a core portion in the magnetic memory device according to the third embodiment of the present invention.
Figure 18A:
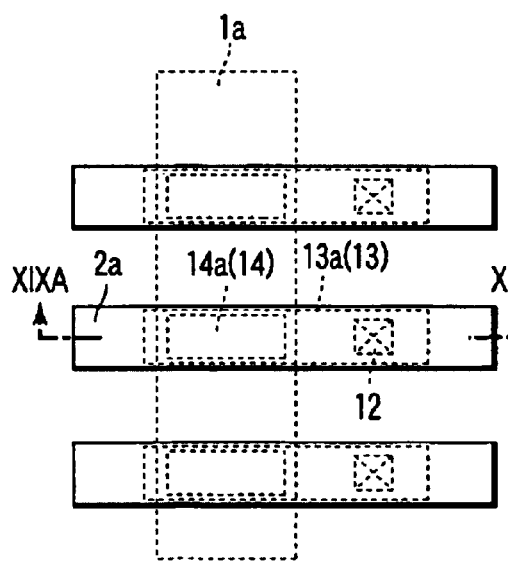
FIG. 18A is a plane view showing a cell portion in another magnetic memory device according to the third embodiment of the present invention.
Figure 18B:
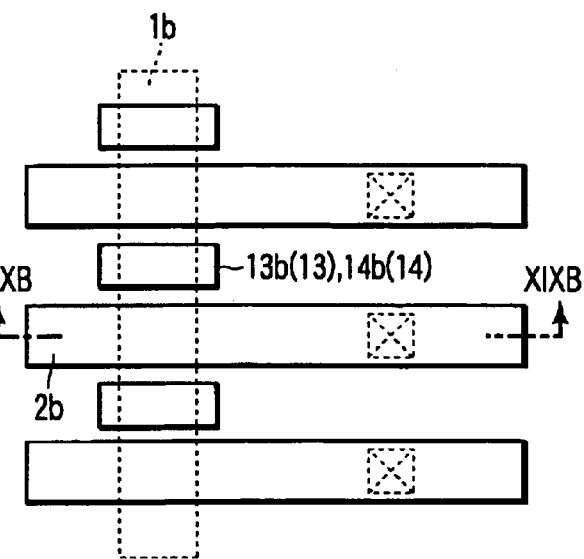
FIG. 18B is a plane view showing a core portion in another magnetic memory device according to the third embodiment of the present invention.

FIGS. 17A and 17B are cross-sectional views showing a magnetic memory device according to the third embodiment of the present invention. FIG. 17A shows a cell portion in the magnetic memory device, and FIG. 17B shows a core portion in the magnetic memory device. Description will be given as to only a point different from the structure of the first embodiment.

As shown in FIGS. 17A and 17B, in the magnetic memory device according to the third embodiment, a difference from the first embodiment lies in that a third insulating film 30 is formed between a second wiring 2b and a dummy magnetoresistive effect element 14b and the second wiring 2b is electrically insulated from the dummy magnetoresistive effect element 14b in the core portion. Of course, the third insulating film 30 is not formed between the second write line 2a and the magnetoresistive effect element 14a in the cell portion.

It is to be noted that the third insulating film 30 is formed after the etch-back process of the second insulating film 21 depicted in FIG. 11B. Therefore, even if patterns of the cell portion and the core portion are different from each other by forming the third insulating film 30 only in the core portion, etching amounts in the cell portion and the core portion are not affected at all when performing etchback of the second insulating film 21. Alternatively, in the etch-back process of the insulating film 21, only flattening is performed to the extent that the contact layer 15 is not exposed, and the remaining insulating film 21 is then etched by using the resist mask that only the cell portion is exposed. As a result, exposing the contact layer 15 only in the cell portion can form the same structure.

According to the third embodiment, the same advantages as those of the first embodiment can be obtained.

In addition, in the third embodiment, the insulating film 30 is provided on the dummy magnetoresistive effect element only in the core portion. Therefore, a capacity between the first and second wirings 1b and 2b can be reduced.

It is to be noted that a method of reducing the capacity between the first and second wirings 1b and 2b is not restricted to the above method. For example, as shown in FIGS. 18A and 18B and FIGS. 19A and 19B, the dummy magnetoresistive effect element 14b and the lower metal layer 13b in the core portion may be shifted from the lower part (area of an intersection of the first and second wirings 1b and 2b) of the second wiring 2b in such a manner they are positioned between the adjacent second wirings 2b.

[Fourth Embodiment]

In the first to third embodiments mentioned above, the cell structure which is of the one transistor+one magnetoresistive effect element type is taken as an example. Thus, in the fourth embodiment, a cell structure which is of a simple cross-point type is taken as an example.

FIGS. 20A, 20B and FIGS. 22A and 22B are plane views showing a magnetic memory device according to the fourth embodiment of the present invention. FIGS. 21A and 21B and FIGS. 23A and 23B are cross-sectional views showing the magnetic memory device according to the fourth embodiment of the present invention. Here, FIGS. 20A, 21A, 22A and 23A show a cell portion in the magnetic memory device, and FIGS. 20B, 21B, 22B and 23B show a core portion in the magnetic memory device.

As shown in FIGS. 20A, 21A, 22A and 23A, in the cell portion of the magnetic memory device according to the fourth embodiment, a magnetoresistive effect element 14a used as a memory element is arranged so as to be connected with a first write line (word line) 1a and a second write line (bit line) 2a at an intersection of the first and second write lines 1a and 2a. It is to be noted that there is no MOS transistor connected to the magnetoresistive effect element 14a as shown in FIG. 2A.

On the other hand, in the core portion of the magnetic memory device according to the fourth embodiment, a dummy magnetoresistive effect element 14b is not formed at the intersection of a first wiring 1b formed on the same surface as the first write line 1a and a second wiring 2b formed on the same surface as the second write line 2a. That is, the dummy magnetoresistive effect element 14b is formed in an area where one of the first and second wirings 1b and 2b exists.

For example, as shown in FIGS. 20B and 21B, the dummy magnetoresistive effect element 14b is arranged under the second wiring 2b in contact with the second wiring 2b. Further, as shown in FIGS. 22B and 23B, the dummy magnetoresistive effect element 14b is arranged on the first wiring 1b in connection with the first wiring 1b.

According to the fourth embodiment, the same advantages as those of the first embodiment can be obtained.

[Fifth Embodiment]

Although the dummy magnetoresistive effect element 14b is provided in the core portion as the example in each of the above-described embodiments, the area in which the dummy magnetoresistive effect element 14b is provided is not restricted thereto.

Thus, in the fifth embodiment, description will be given as to an area where the dummy magnetoresistive effect element 14b is provided.

Figure 24:
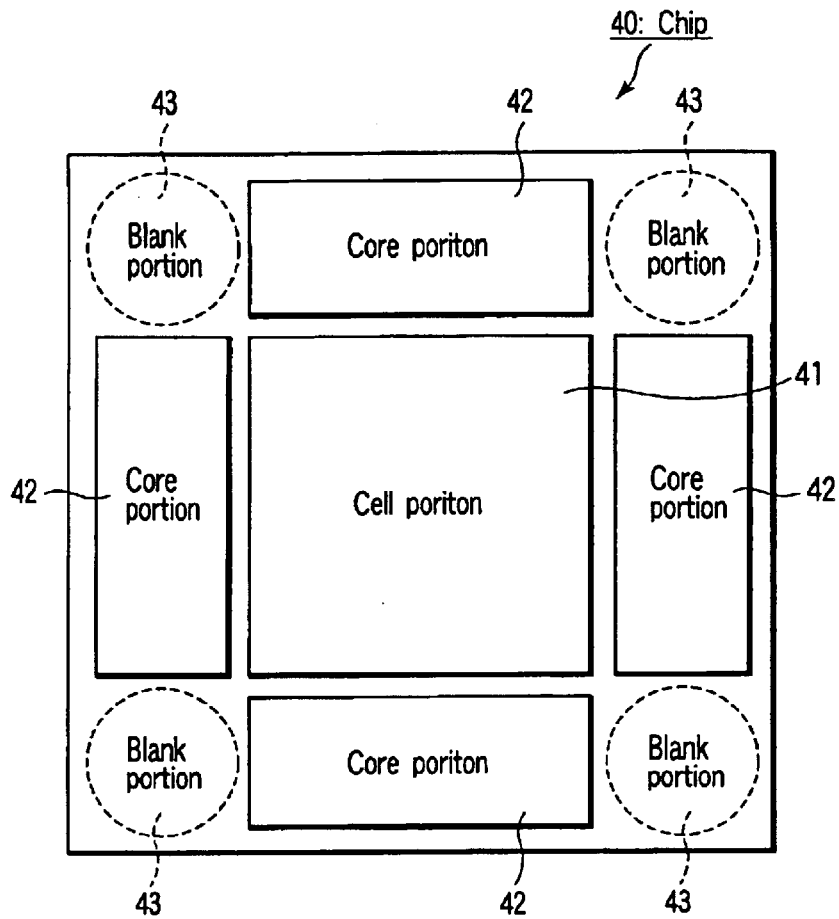
FIG. 24 is a plane view showing a chip according to a fifth embodiment of the present invention.

FIG. 24 is a plane view showing a chip in a magnetic memory device according to the fifth embodiment of the present invention. As shown in FIG. 24, roughly, a cell portion 41, core portions 42 and blank portions 43 exist in a chip 40.

Here, the cell portion 41 means a memory cell area where a magnetoresistive effect element in which data "1" and "0" are written exists. The core portion 42 means an area which is positioned around the cell portion and has therein a peripheral circuit electrically connected with the cell portion. In the core portions 42, there exist, e.g., a driver, a sinker, a decoder, a sense amplifier, an input/output portion and others. The blank portion 43 means an unused area which is not utilized as the cell portion 41 or the core portion 42, and the blank portion 43 exists at a corner part of the chip 40, for example.

The dummy magnetoresistive effect element 14b described in connection with the first to fourth embodiments may be arranged in any area of the cell portion 41, the core portions 42 and the blank portions 43. At that time, it is desirable that magnetoresistive effect elements 14a and 14b as a combination of the magnetoresistive effect element 14a as a memory element and the dummy magnetoresistive effect element 14b are arranged in the entire chip in such a manner the similar density can be obtained when extracting any area in the chip 40. It is to be noted that the dummy magnetoresistive effect element 14b may be arranged in at least a part of the core portion 42.

Further, a pattern covering ratio of the magnetoresistive effect element 14b provided as a dummy (which will be referred to as a dummy MR element hereinafter) may be equal to or different from a pattern covering ratio of the magnetoresistive effect element which serves as a memory element provided in the cell portion (which will be referred to as a cell MR element hereinafter), and there are the following two examples.

As a first example, the pattern covering ratio of the dummy MR element 14b is set approximately equal to the pattern covering ratio of the cell MR element 14a. In this case, it is desirable to set the pattern covering ratio of the dummy MR element 14b to be 50% to 200% of the pattern covering ratio of the cell MR element 14a.

As a second example, the pattern covering ratio of the dummy MR element 14b is set larger than that of the cell MR element 14a, and it is set to be, e.g., twofold to ten-fold of the pattern covering ratio of the counterpart.

[Sixth Embodiment]

In each of the above-described embodiments, the dummy magnetoresistive effect element 14b is provided on the chip. Therefore, when comparing in the same cell structure, the pattern covering ratio of the magnetoresistive effect elements 14a and 14b relative to the entire chip in each of the foregoing embodiments is different from that of the prior art in which no dummy magnetoresistive effect element exists.

Thus, paying notice to this point, in the sixth embodiment, description will be given as to a desirable extent that an occupied area of the magnetoresistive effect elements 14a and 14b as a combination of the magnetoresistive effect element 14a functioning as a memory element and the dummy magnetoresistive effect element 14b is set relative to the entire chip in order to improve the effect.

Incidentally, in the following description, when the pattern covering ratio of the magnetoresistive effect elements 14a and 14b relative to the entire chip is obtained, the "entire chip" means both (1) the case that it consists of three areas, i.e., the cell portion+the core portion+the blank portion shown in FIG. 24 and (2) the case that it consists of two areas, i.e., the cell portion+the core portion shown in FIG. 24.

First, the structure of one transistor+one magnetoresistive effect element like the first to third embodiments and the simple cross-point structure like the fourth embodiment are taken as examples, and a percentage of the occupied area of the magnetoresistive effect elements 14a and 14b per chip is examined based on the occupied area of the magnetoresistive effect element 14a per cell. It is to be noted that "F" used in the following description designates a minimum processing dimension.

Figure 25:
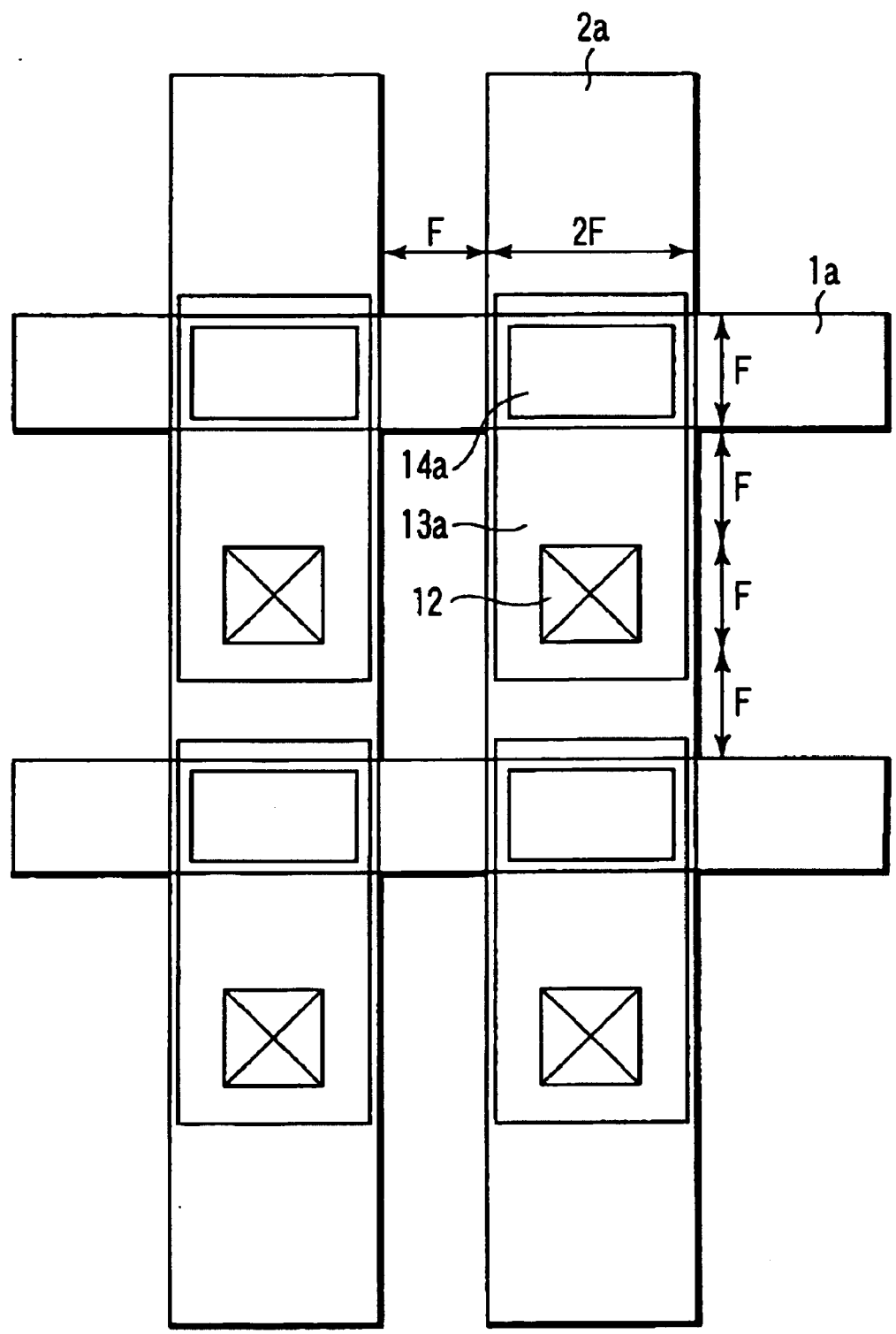
FIG. 25 is a plane view showing a cell portion which is of a one transistor+one magnetoresistive effect element type according to the fifth embodiment of the present invention.
Figure 27A:
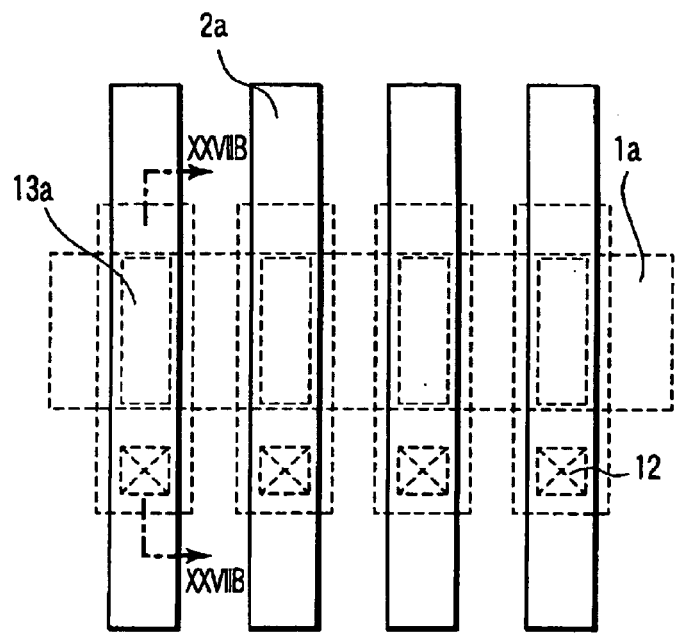
FIG. 27A is a plane view showing a magnetic memory device according to a prior art.
Figure 27B:
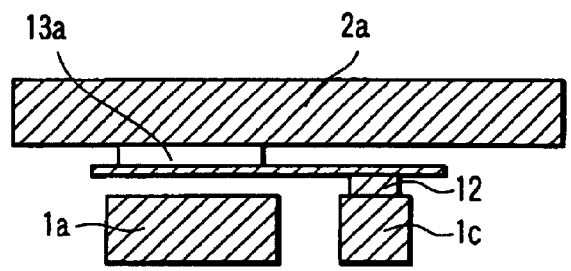
FIG. 27B is a cross-sectional view showing the magnetic memory device taken along the line XXVIIB—XXVIIB in FIG. 27A.
Figure 28A:
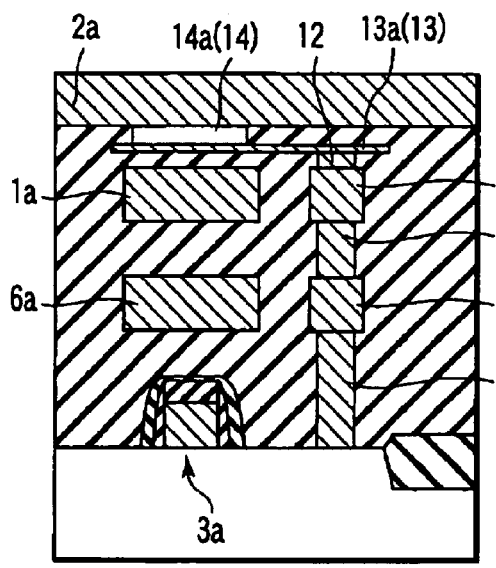
FIG. 28A is a cross-sectional view showing a cell portion in the magnetic memory device according to the prior art.
Figure 28B:
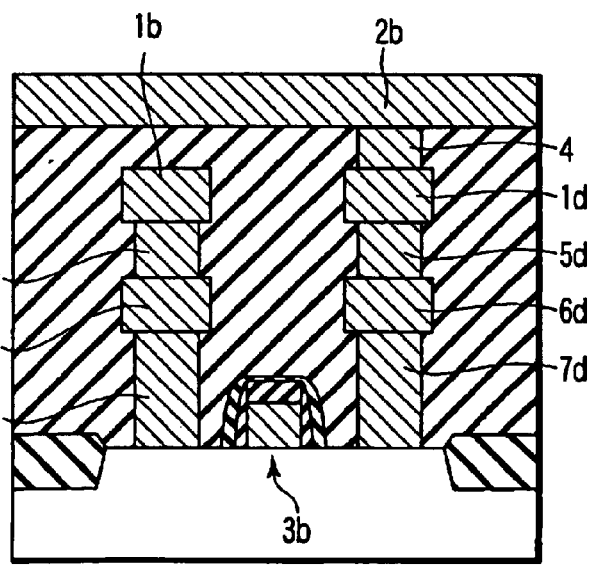
FIG. 28B is a cross-sectional view showing a core portion in the magnetic memory device according to the prior art.
Figure 29A:
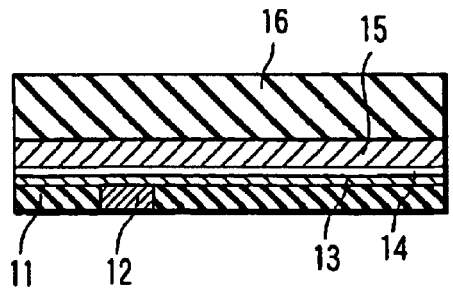
Figure 29B:
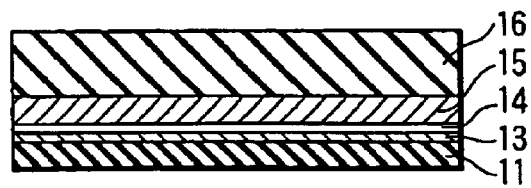
Figure 30A:
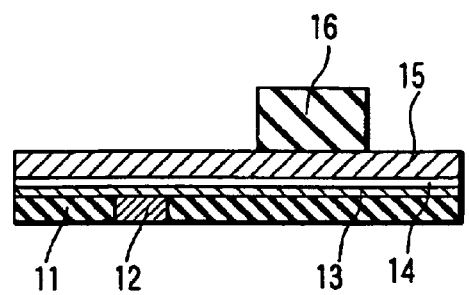
Figure 30B:
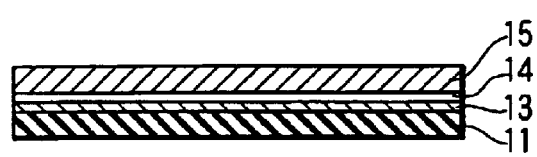
Figure 31A:
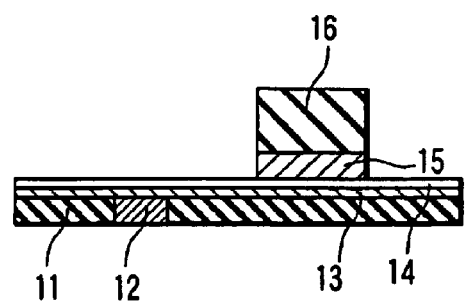
Figure 31B:
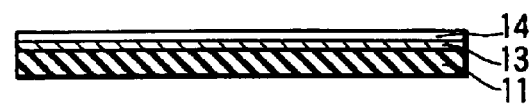
Figure 32A:
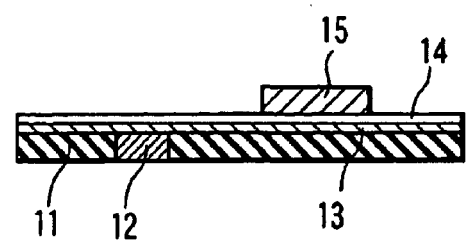
Figure 32B:
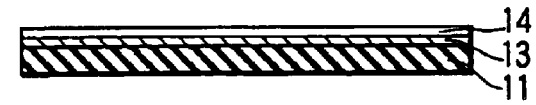

As shown in FIG. 25, in the structure of one transistor+one magnetoresistive effect element, it is assumed that a width of the first write line 1a is defined as "F", a width of the second write line 2a is defined as "2F", a gap between the magnetoresistive effect element 14a and the contact 12 is defined as "F", and a gap between adjacent cells is defined as "F".

In this case, an area S1 of one cell is represented by the following expression (1), and an area S2 of the magnetoresistive effect element 14a is represented by the following expression (2).

$$S1=(2F+F)\times(F+F+F+F)=12F^2 \quad (1)$$

$$S2=2F\times F=2F^2 \quad (2)$$

Therefore, based on the expressions (1) and (2), the pattern covering ratio S3 of the magnetoresistive effect element 14a per cell can be represented by the following expression (3).

$$S3=S2/S1=2F^2/12F^2=1/6 \approx 0.16 \quad (3)$$

Thus, considering based on this estimation, it is good enough to determine the pattern covering ratio of the magnetoresistive effect elements 14a and 14b relative to the entire chip to, e.g., approximately 16% in case of the structure of one transistor+one magnetoresistive effect element.

Figure 26:
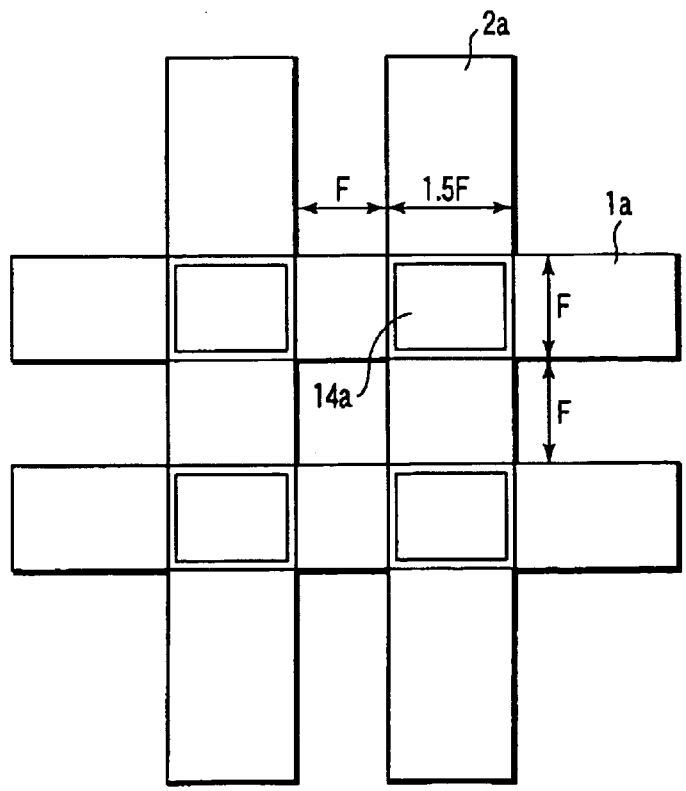
FIG. 26 is a plane view showing a cell portion which is of a simple cross-point type according to the fifth embodiment of the present invention.

As shown in FIG. 26, in the simple cross-point structure, it is assumed that a width of the first write line 1a is defined as "F", a width of the second write line 2a is defined as "1.5F" and a gap between adjacent cells is defined as "F".

In this case, an area S4 per cell is represented by the following expression (4), and an area S5 of the magnetoresistive effect element 14a is represented by the following expression (5).

$$S4=(1.5F+F)\times(F+F)=5F^2 \quad (4)$$

$$S5=1.5F\times F=1.5F^2 \quad (5)$$

Therefore, based on the expressions (4) and (5), a pattern covering ratio S6 of the magnetoresistive effect element 14a per cell can be represented by the expression (6).

$$S6=S5/S4=1.5F^2/5F^2=0.3 \quad 6)$$

Thus, considering based on this estimation, it is good enough to determine the pattern covering ratio of the magnetoresistive effect elements 14a and 14b relative to the entire chip as, e.g., approximately 30% in the simple cross-point structure.

Considering the pattern covering ratio of the magnetoresistive effect elements 14a and 14b relative to the entire chip based on the pattern covering ratio of the magnetoresistive effect element 14a per cell in various cell structures by the above-described method, the pattern covering ratio of the magnetoresistive effect elements 14a and 14b relative to the entire chip, e.g., 5% to 80% is desirable, and 5% to 40% is more desirable. Furthermore, taking the end point detection sensitivity into consideration, 10% to 40% is further desirable.

Here, 5% is derived from (F×F)/(5F×4F), 80% is derived from (9F×9F)/(10F×10F), and 40% is derived from (4F×F)/(5F×2F). These numeric values are set based on pattern covering ratio of the magnetoresistive effect element 14a which can be taken in the cell portion.

It is to be noted that, e.g., approximately 5% to 80% is desirable as the pattern covering ratio of the magnetoresistive effect elements 14a and 14b relative to the entire chip (percentage of an occupying area of the magnetoresistive effect elements per unit area in the chip) as described above. In other words, it is desirable that a sum total of the occupying areas of the magnetoresistive effect elements 14a and 14b which are the dummy element and the non-dummy element is 5% to 80% of a predetermined area larger than an area which approximately corresponds to at least one cell arbitrarily selected from the chip. Here, as to the size of the predetermined area, approximately tenfold of one cell is desirable and, e.g., the size of approximately 0.1 square millimeter (square in which one side is 0.1 mm) is further desirable. Moreover, as to the shape of the predetermined area, it is desirable to adopt an isotropic shape, e.g., a circle or a regular polygon (polygon in which respective sides are equal and respective angles are equal) such as a regular tetragon or a regular hexagon.

In this case, although it is desirable that the dimension or the area of magnetoresistive effect element 14a as a memory element is equal to that of the dummy magnetoresistive effect element 14b, they may be different from each other. For example, if one area is small in the both magnetoresistive effect elements 14a and 14b (e.g., if it is not more than 10 $\mu m^2$), one area in the magnetoresistive effect element 14a may be different tenfold from one area in the dummy magnetoresistive effect element 14b.

It is to be noted that, in each of the foregoing embodiments, the magnetoresistive effect element is, e.g., a GMR (Giant Magneto-Resistance) element, an MTJ (Magnetic Tunneling Junction) element or the like.

In addition, a transistor may be provided in place of the MOS transistor in each of the foregoing embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A method of manufacturing a magnetic memory device having a memory cell portion and a peripheral circuit portion, comprising:

forming a first metal material film in each of the memory cell portion and the peripheral circuit portion;

forming a magnetoresistive effect film on the first metal material film in each of the memory cell portion and the peripheral circuit portion;

forming a cap film on the magnetoresistive effect film in each of the memory cell portion and the peripheral circuit portion;

forming a first cap layer by patterning the cap film of the memory cell portion into a first shape, and forming a second cap layer by patterning the cap film of the peripheral circuit portion into a second shape;

forming a first magnetoresistive effect element which functions as a memory element by patterning the magnetoresistive effect film of the memory cell portion into the first shape by using the first cap layer, and forming a second magnetoresistive effect element which functions as a dummy by patterning the magnetoresistive effect film of the peripheral circuit portion into the second shape by using the second cap layer;

forming a first metal layer by patterning the first metal material film of the memory cell portion into a third shape, and forming a second metal layer by patterning the first metal material film of the peripheral circuit portion into a fourth shape;

forming a first insulating film on the first and second cap layers and the first and second metal layers in each of the memory cell portion and the peripheral circuit portion;

flattening the first insulating film; and removing the first insulating film until a surface of the first cap layer is exposed.

2. The method of manufacturing a magnetic memory device according to claim 1, wherein the fourth shape is approximately the same as the second shape.

3. The method of manufacturing a magnetic memory device according to claim 1, further comprising forming a second insulating film on a exposed surface of the second cap layer and the first insulating film only in the peripheral circuit portion.

4. The method of manufacturing a magnetic memory device according to claim 1, wherein the first and second cap layers are formed of conductive films and are used as contacts.

5. The method of manufacturing a magnetic memory device according to claim 1, further comprising:

forming a first hard mask having the first shape on the cap film in the memory cell portion;

forming a second hard mask having the second shape on the cap film in the peripheral circuit portion;

patterning the cap film by using the first and second hard masks; and removing the first and second hard masks.

6. The method of manufacturing a magnetic memory device according to claim 5, wherein the first and second hard masks are insulating films.

7. The method of manufacturing a magnetic memory device according to claim 1, wherein a plurality of the second magnetoresistive effect elements are formed on at least a part of the peripheral circuit portion, and a sum total of occupying areas of the plurality of the second magnetoresistive effect elements is 5% to 80% of the peripheral circuit portion.

8. The method of manufacturing a magnetic memory device according to claim 7, wherein an occupying area of the second magnetoresistive effect element is approximately equal to that of the first magnetoresistive effect element.

9. The method of manufacturing a magnetic memory device according to claim 1, wherein a plurality of the second magnetoresistive effect elements are formed on the whole of the memory cell portion, and a sum total of occupying areas of the plurality of the second magnetoresistive effect elements is 5% to 80% of a predetermined area arbitrarily selected from the peripheral circuit portion.

10. The method of manufacturing a magnetic memory device according to claim 9, wherein an occupying area of the second magnetoresistive effect element is equal to that of the first magnetoresistive effect element.

11. The method of manufacturing a magnetic memory device according to claim 1, wherein a plurality of the second magnetoresistive effect elements are formed on the entire memory chip, a sum total of occupying areas of a plurality of the first magnetoresistive effect elements and the plurality of second magnetoresistive effect elements is 5% to 80% of a predetermined area arbitrarily selected from the memory chip.

* * * * *